US011863141B2

(12) United States Patent
Minokami et al.

(10) Patent No.: US 11,863,141 B2
(45) Date of Patent: Jan. 2, 2024

(54) AUDIO EQUIPMENT INCLUDING ROTARY OPERATION UNIT, OPERATION DETECTING SECTION, POWER SUPPLYING SECTION, AND MONITORING SECTION

(71) Applicant: AlphaTheta Corporation, Yokohama (JP)

(72) Inventors: Jun Minokami, Yokohama (JP); Naomi Amemiya, Yokohama (JP); Eiji Kojima, Yokohama (JP); Tadashi China, Yokohama (JP)

(73) Assignee: ALPHATHETA CORPORATION, Yokohama (JP)

( * ) Notice: Subject to any disclaimer, the term of this patent is extended or adjusted under 35 U.S.C. 154(b) by 259 days.

(21) Appl. No.: 17/435,207

(22) PCT Filed: Mar. 1, 2019

(86) PCT No.: PCT/JP2019/008136
§ 371 (c)(1),
(2) Date: Aug. 31, 2021

(87) PCT Pub. No.: WO2020/178907
PCT Pub. Date: Sep. 10, 2020

(65) Prior Publication Data
US 2022/0137691 A1 May 5, 2022

(51) Int. Cl.
*H03G 3/02* (2006.01)
*G06F 3/16* (2006.01)

(52) U.S. Cl.
CPC ............. *H03G 3/02* (2013.01); *G06F 3/165* (2013.01)

(58) Field of Classification Search
CPC . G06F 3/165; H03G 3/02; H01H 3/08; G10H 1/46; H03K 2217/94057; H03K 17/975
See application file for complete search history.

(56) References Cited

U.S. PATENT DOCUMENTS 4,947,097 A * 8/1990 Tao ..................... B60K 37/06
74/553
9,194,721 B2 * 11/2015 Backes .................... G01B 7/30
(Continued)

FOREIGN PATENT DOCUMENTS

EP    1 260 978 A2    11/2022
JP    2000-251569    9/2000
(Continued)

OTHER PUBLICATIONS

International Search Report dated Jun. 4, 2019, Application No. PCT/JP2019/008136, English translation included, 3 pages.
(Continued)

*Primary Examiner* — Jason R Kurr
(74) *Attorney, Agent, or Firm* — Rankin, Hill & Clark LLP

(57) ABSTRACT

There is provided audio equipment that enables power supply and signal connection to a rotary operation unit in a non-contact manner. The audio equipment includes: the rotary operation unit rotatably supported in relation to an equipment body; an operation detecting section provided for the rotary operation unit and in which an electric load changes in response to a pressing operation; a power supplying section provided for the equipment body and configured to supply power to the operation detecting section in a non-contact manner; and a monitoring section configured to monitor the power supplied by the power supplying section to detect the user's operation from a change in the power.

8 Claims, 3 Drawing Sheets

(56) References Cited

U.S. PATENT DOCUMENTS

2002/0172107 A1* 11/2002 Yamada ............... G10H 1/0091
2016/0070275 A1* 3/2016 Anderson ................ G10H 1/46
                                                        700/275

FOREIGN PATENT DOCUMENTS

| JP | 2002-343026 | 11/2002 |
|----|-------------|---------|
| JP | 4571973 | 10/2010 |
| WO | 2013/140440 | 9/2013 |

OTHER PUBLICATIONS

European Search Report dated Aug. 18, 2022, Application No. 19917764.3, 7 pages.
English translation of International Preliminary Report on Patentability dated Aug. 25, 2021, Application No. PCT/JP2019/008136, 6 pages.

* cited by examiner

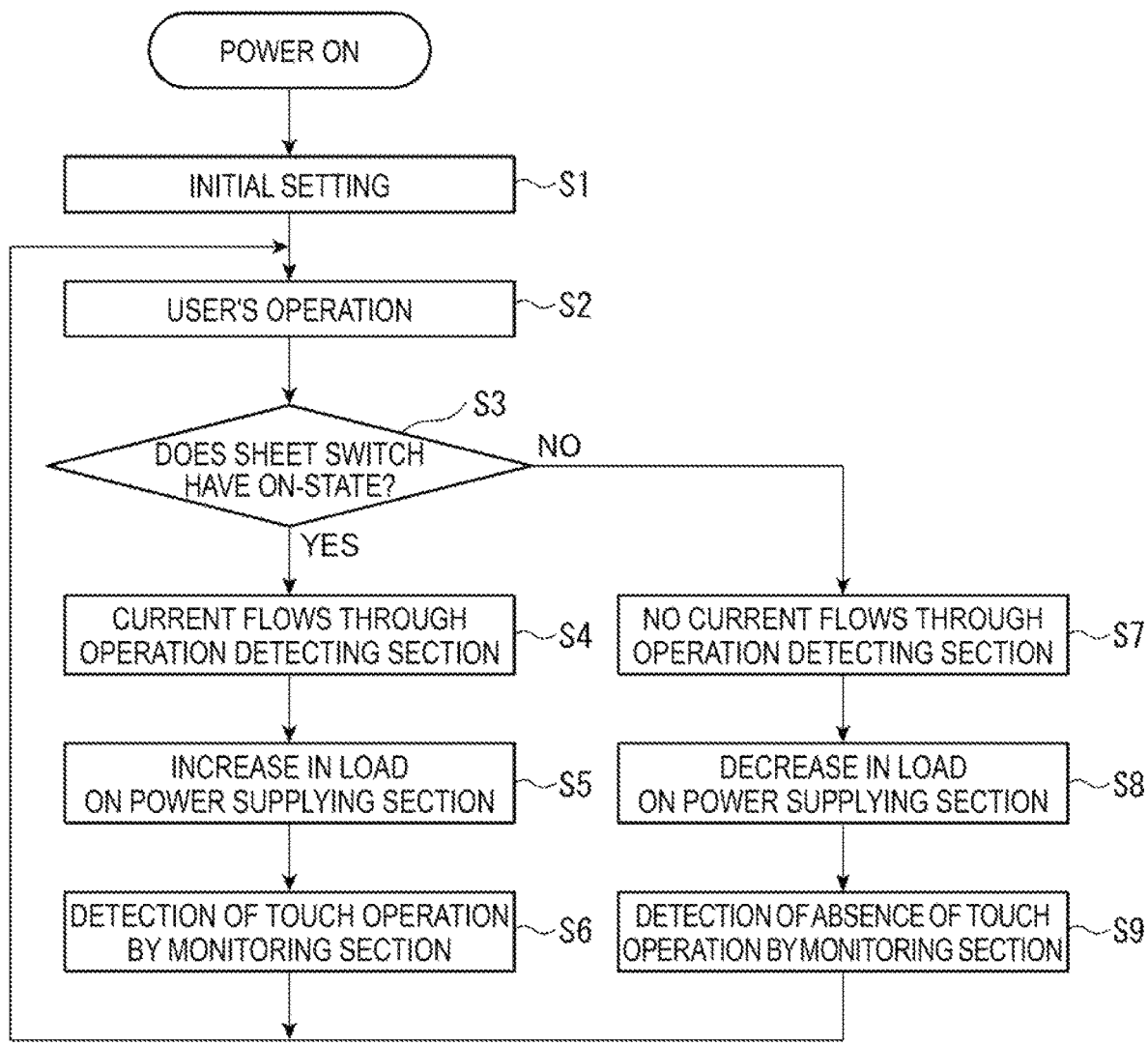

AUDIO EQUIPMENT INCLUDING ROTARY OPERATION UNIT, OPERATION DETECTING SECTION, POWER SUPPLYING SECTION, AND MONITORING SECTION

TECHNICAL FIELD

The present invention relates to audio equipment (acoustic device).

BACKGROUND ART

Audio equipment is provided with a rotary operation unit. Examples of the rotary operation unit range from a simple rotary operation unit like a volume nob for controlling sound volume to a jog dial of DJ equipment with which a disc jockey (DJ) performs various operations.

In the jog dial of the DJ equipment, rotation of a dial(s) and touch by a DJ are detected (see, Patent Literature 1).

A scale attached to the jog dial and a sensor secured to a DJ equipment body are used to detect the rotation. A displacement of the scale due to the rotation is read by the sensor and processed by a detection circuit. A direction and speed of the jog dial are thus detected.

A ring-shaped sheet switch arranged under the jog dial is used for the touch detection. The detection circuit is connected to the sheet switch. When a DJ presses a surface of the jog dial, part of the jog dial presses the sheet switch to switch the sheet switch on and off. This allows the detection circuit to detect the presence or absence of a touch operation.

Since the detection circuit needs power supply, the detection circuit is installed in a main body of the DJ equipment. The sheet switch connected to the detection circuit through a signal line is also installed in the main body of the DJ equipment.

In the jog dial, many rollers are arranged circularly with respect to the sheet switch secured. The sheet switch is pressed via the rollers.

In addition to the sheet switch, a touch detection unit may be a touch sensor provided on a surface of a jog dial to directly detect a DJ's touch operation (see, Patent Literature 2). For example, an electrostatic capacitance sensor or the like may be used as such a touch sensor.

CITATION LIST

Patent Literatures

Patent Literature 1: Japanese Patent No. 4571973
Patent Literature 2: International Publication No. WO2013/140440

SUMMARY OF THE INVENTION

Problems to be Solved by the Invention

In the jog dial in the sheet switch type described above, many rollers roll over the sheet switch. Rotation resistance can thus not be reduced below a certain level, making mechanical operating noise. This may disturb a DJ performance. However, due to power supply and signal connection, the detection circuit and the sheet switch are arranged on a main body side of the DJ equipment and many rollers or the like are indispensable.

On the other hand, in the jog dial in the touch sensor system, there is no mechanical rolling motion, and a rotary operation and touch operation are easy to perform. However, the touch sensor system has such a problem that the sheet switch is switched on and off at a point of time at which a DJ touches the surface of the jog dial. This is thus not suitable for an existing DJ operation.

In the existing DJ operation, a DJ typically puts his/her fingertip(s) or the like on the surface of the jog dial, and presses the surface hard with the fingertip at a desired timing. This operation utilizes characteristics of the conventional sheet switch in which predetermined pressing force is required for switching the sheet switch on and off, and has an advantage in which the switching operation can be executed quickly and accurately at a desired timing by putting a fingertip(s) on the jog dial in advance.

In the touch sensor type, however, switching the sheet switch on and off is executed at a timing at which a DJ's fingertip(s) come(s) into contact with the jog dial. Thus, a DJ cannot put his/her fingertip(s) on the jog dial in advance, making it difficult to perform the existing DJ operation.

An object of the invention is to provide audio equipment that enables power supply and single connection to a rotary operation unit in a non-contact manner.

Means for Solving the Problem(s)

Audio equipment of the invention includes: a rotary operation unit configured to be rotatably supported in relation to an equipment body; an operation detecting section provided for the rotary operation unit and in which an electric load changes in response to a user's operation through pressing or contact; a power supplying section provided for the equipment body and configured to supply power to the operation detecting section in a non-contact manner; and a monitoring section configured to monitor the power supplied by the power supplying section to detect the user's operation from a change in the power.

BRIEF EXPLANATION OF DRAWINGS

FIG. 3 is a flowchart of operations of the exemplary embodiment.

DESCRIPTION OF EMBODIMENT(S)

In the following, an exemplary embodiment of the invention is explained on the basis of the attached drawings.

Figure 1:
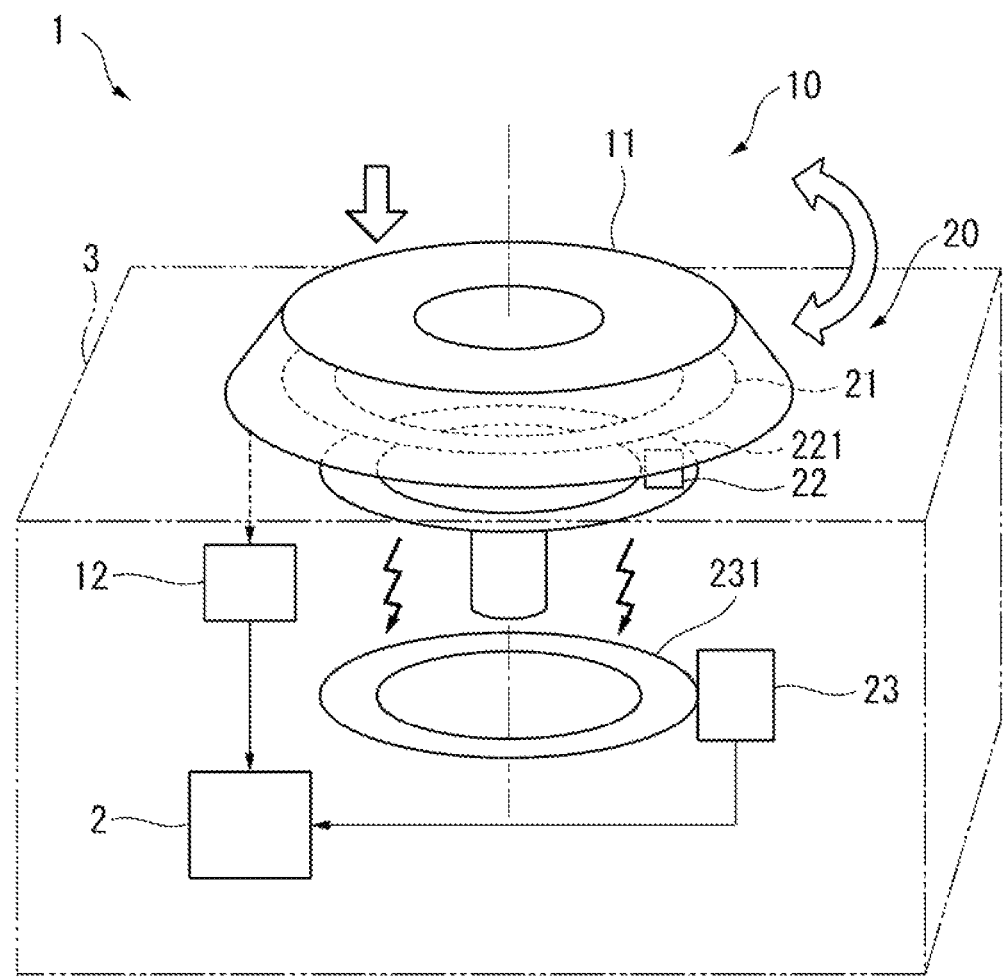
FIG. 1 is a perspective view of audio equipment according to an exemplary embodiment of the invention.

FIG. 1 shows a music data playing control system 1 that is an exemplary embodiment of audio equipment of the invention. The music data playing control system 1 includes a computer system 2, which includes a processor and a memory. Music data such as MP3 is played by executing music player application software on the computer system 2, and the played music data can be outputted, as a sound, from an amplification device and a speaker (not shown).

The computer system 2 of the music data playing control system 1 can execute, through a user's operations, a variety of special operation processes and a sound effecting process on the music data being played. For allowing a user to perform the above processes, the music data playing control system 1 includes a DJ controller 10, which includes a jog dial 11 that is a rotary operation unit.

The jog dial 11 is placed on an upper surface of a casing 3, which is an equipment body. The jog dial 11 is rotatably supported around a perpendicular axis. When a user touches the jog dial 11 to perform a rotary operation, the jog dial 11 gives a command for fast-forwarding or reversing music data to be played on the computer system 2.

The jog dial 11 includes a rotation detecting unit 12 that detects a user's rotary operation. The rotation detecting unit 12 may use, for example, a ring-shaped scale provided in the jog dial 11 and a sensor provided in the casing 3 so that the sensor detects a moving direction and circumferential speed in a circumferential direction of the scale.

The jog dial 11 includes a touch detecting unit 20 that detects a user's touch operation.

The touch detecting unit 20 includes a sheet switch 21 and a switch circuit board 22 provided in the jog dial 11, and a power-supplying circuit board 23 provided in the casing 3.

The sheet switch 21 includes a plurality of switching elements also referred to as a membrane switch, which can be switched on and off by elastic deformation of sheet-shaped electrodes, being arranged circularly.

The sheet switch 21 is placed on a surface of the jog dial 11. An operation for switching on and off the sheet switch 21 is performed by a user pressing the sheet switch 21 downward. The sheet switch 21 is not switched on and off by a user touching the jog dial 11 lightly. The sheet switch 21 is switched on and off when a user applies predetermined pressing force to the jog dial 11.

Since the sheet switch 21 is formed in a ring shape, a user can obtain the same operational feeling regardless of a rotary angle position of the jog dial 11.

The switch circuit board 22 is connected to a power receiving coil 221, and the power-supplying circuit board 23 is connected to a power supplying coil 231.

The power receiving coil 221 and the power supplying coil 231 are printed coils with patterns formed on ring-shaped printed boards. The power receiving coil 221 is attached to the jog dial 11 and the power supplying coil 231 is secured to the casing 3. The power receiving coil 221 faces the power supplying coil 231 at a predetermined interval. When alternating current is supplied to the power supplying coil 231, alternating voltage is generated in the power receiving coil 221 by electromagnetic induction.

Figure 2:
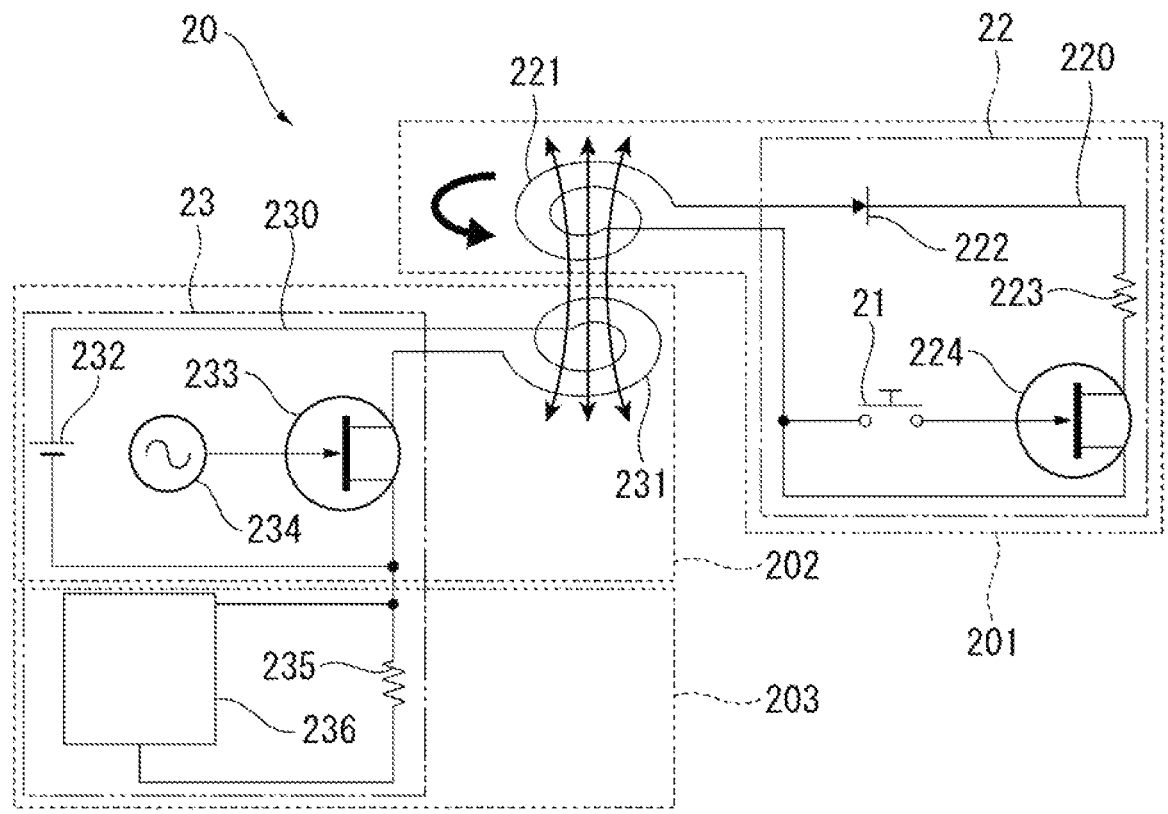
FIG. 2 is a circuit diagram of the exemplary embodiment.

FIG. 2 shows a circuit configuration of the touch detecting unit 20 including the sheet switch 21, the switch circuit board 22, and the power-supplying circuit board 23.

The switch circuit board 22 includes a rectifying diode 222, a load resistor 223, and a circuit opening/closing FET element 224 (field-effect transistor). The power receiving coil 221, the rectifying diode 222, the load resistor 223, and the FET element 224 are connected in series to form a loop-shaped receiving circuit 220.

The sheet switch 21 is connected to a gate of the FET element 224, thus making it possible to open and close the receiving circuit 220 formed of the power receiving coil 221, the diode 222, the load resistor 223 and the FET element 224.

When alternating voltage is generated in the power receiving coil 221 after the sheet switch 21 switches on the FET element 224, a current is generated in the receiving circuit 220 formed of the diode 222, the load resistor 223, and the FET element 224.

When alternating voltage is generated in the power receiving coil 221 after the sheet switch 21 switches off the FET element 224, the receiving circuit 220 is shut off and no current flows therethrough.

Switching the sheet switch 21 on and off causes a current to intermittently flow through the receiving circuit 220, making it possible to switch load power to be supplied from the power receiving coil 221 to the switch circuit board 22.

An operation detecting section 201 of the invention is configured by the receiving circuit 220 including the sheet switch 21 and the power receiving coil 221.

The power-supplying circuit board 23 includes a direct-current (DC) power source 232, a FET element for drive 233, and an oscillation circuit 234. The power supplying coil 231, the DC power source 232, the FET element for drive 233, and the oscillation circuit 234 are connected in series to form a loop-shaped power-supplying circuit 230. The oscillation circuit 234 is connected to a gate of the FET element for drive 233. The FET element 233 increases or decreases, in response to an alternating-current signal (AC signal) from the oscillation circuit 234, a current flowing through the power supplying circuit 230 formed of the DC power source 232, the power supplying coil 231, and the FET element 233. An alternating-current magnetic field is generated in the power supplying coil 231 depending on the increase or decrease in the current, generating alternating voltage in the power receiving coil 221 disposed in the vicinity of the power supplying coil 231.

A power supplying section 202 of the invention is configured by the power supplying coil 231, the DC power source 232, the FET element for drive 233, and the oscillation circuit 234.

The DC power source 232 and the oscillation circuit 234 may be replaced with the computer system 2.

The power-supplying circuit board 23 includes a load detecting resistor 235 connected to the power supplying circuit 230 and a monitoring circuit 236 that detects a current flowing through the load detecting resistor 235.

A current, which corresponds to the current flowing through the power supplying circuit 230 of the power supplying section 202, flows through the load detecting resistor 235. The monitoring circuit 236 can thus detect a current of the power supplying circuit 230 of the power supplying section 202 from a current flowing through the load detecting resistor 235.

The current in the power supplying section 202 depends on the increase or decrease in load power of the operation detecting section 201, and the load power of the operation detecting section 201 changes in response to switching on and off in the sheet switch 21. It is thus possible to detect the switching on and off in the sheet switch 21 (user's touch operation) by detecting the change in a current of the power supplying section 202 using the monitoring circuit 236. That is, the detection of the touch operation by the operation detecting section 201 can be transmitted as a signal by using a non-contact power supply route from the power supplying section 202 to the operation detecting section 201.

A monitoring section 203 of the invention is configured by the load detecting resistor 235 and the monitoring circuit 236.

The monitoring circuit 236 may be replaced with the computer system 2.

In the music data playing control system 1 according to the exemplary embodiment, processes based on a user's touch operation are executed in accordance with the following procedure.

Initial setting is executed on respective parts or components including the computer system 2 and the DJ controller 10 (process S1), when the music data playing control system 1 is turned on.

When music data is played, the DJ controller 10 receives a user's operation (rotary operation or touch operation performed on the jog dial 11) (process S2).

When the user's operation is the touch operation performed on the jog dial 11, the user's operation is processed by the touch detecting unit 20 (processes S3 to S9).

When the user's touch operation is performed with pressing force of equal to or greater than predetermined pressing force, the sheet switch 21 of the jog dial 11 is switched on (S3: YES).

With the sheet switch 21 switched on, a current flows through the receiving circuit 220 of the operation detecting section 201 (process S4). This increases a load on the power supplying section 202 (process S5), and the monitoring section 203 detects the increase as the touch operation (process S6).

When the touch operation is detected, the DJ controller 10 gives a command to the computer system 2 together with the rotary operation performed on the jog dial 11, changing a play process running on the computer system 2.

When a user touches the jog dial 11 with pressing force of less than the predetermined pressing force, or when a user does not touch the jog dial 11, the sheet switch 21 of the jog dial 11 is switched off (S3: NO).

With the sheet switch 21 switched off, no current flows through the receiving circuit 220 of the operation detecting section 201 (process S7). This decreases a load on the power supplying section 202 (process S8), and the monitoring section 203 detects the decrease as the absence of the touch operation (process S9).

When the absence of the touch operation is detected, the DJ controller 10 returns the play process running on the computer system 2 to a normal state.

The exemplary embodiment offers the following advantages.

In the music data playing control system 1 according to the exemplary embodiment, the touch detecting unit 20 of the DJ controller 10 includes the operation detecting section 201 in which the sheet switch 21 is provided in the jog dial 11. Thus, in the exemplary embodiment, a DJ, which is a user, can perform the conventional touch operation suitable for the DJ performance, in which the DJ puts a fingertip(s) or the like on the surface of the jog dial 11 and presses the surface hard with the fingertip at a desired timing, similarly to the existing sheet switch system.

In the touch detecting unit 20 of the exemplary embodiment, the jog dial 11 is provided with the operation detecting section 201 including the sheet switch 21.

A user's touch operation can thus be received directly by the sheet switch 21 (or with a minimum interposed object, such as a cover plate). This eliminates the need for the structure in which the sheet switch is installed close to a main body side of the DJ equipment and many rollers are provided between the sheet switch and the jog dial to roll over the sheet switch, like the conventional sheet switch type. The arrangement according to the exemplary embodiment thus has a simple structure and eliminates mechanical operating noise. Further, the arrangement according to the exemplary embodiment eliminates the rolling movement of the rollers, minimizing rotation resistance of the jog dial 11. A user can thus perform a rotary operation smoothly.

In the touch detecting unit 20 of the exemplary embodiment, the operation detecting section 201 including the sheet switch 21 is provided in the jog dial 11. The operation detecting section 201 thus rotates with respect to the casing 3. However, the power supplying section 202 installed in the casing 3 supplies power to the operation detecting section 201 in a non-contact manner via the power supplying coil 231 and the power receiving coil 221.

Further, it is possible to detect switching on and off in the sheet switch 21 (user's touch operation) through detection of the change in a current of the power supplying section 202 using the monitoring section 203. That is, the detection of the touch operation by the operation detecting section 201 can be transmitted as a signal by using the non-contact power supply route from the power supplying section 202 to the operation detecting section 201.

The invention is thus capable of providing the music data playing control system 1 that enables the power supply and signal connection to the jog dial 11 in a non-contact manner.

The invention is not limited to the above exemplary embodiment but includes modifications as long as such modifications are compatible with the invention.

In the exemplary embodiment, the sheet switch 21 is exemplified, as the switching element, in the operation detecting section 201 of the invention. However, any other switching element that can be switched by a user's operation with pressing force of equal to or greater than a predetermined pressing force may be used. For example, it is possible to use a switching element formed by circularly arranging mechanical switches or a combination of a pressure sensitive sensor and a switch circuit.

Further, the switching element is not limited to a switching element that is switched by pressing force of equal to or greater than a predetermined pressing force, like the sheet switch 21. An electrostatic capacitance sensor that is switched by contact or any other contact sensor may be used. Such a sensor can detect the switching on and off with higher speed than the detection based on a user's pressing operation. However, in order to provide a user with the conventional touch operation suitable for the DJ performance in which a DJ puts a fingertip(s) on the surface of the jog dial 11 and presses the surface hard with the fingertip at a desired timing, the contact sensor preferably detects a user's pressing operation.

In the operation detecting section 201 according to the exemplary embodiment, the receiving circuit 220 receiving power via the power receiving coil 221 is formed in the switch circuit board 22. An electric load on the receiving circuit 220 is switched by the sheet switch 21. The configuration of the receiving circuit 220 may be changed as appropriate. It is only required that the receiving circuit 220 is provided for the jog dial 11 (rotary operation unit) and the electric load changes in response to a user's operation.

In the power supplying section 202 according to the exemplary embodiment, the power supplying circuit 230 supplying power from the power supplying coil 231 to the power receiving coil 221 in a non-contact manner is formed in the power-supplying circuit board 23. The configuration of the power supplying circuit 230 may be changed as appropriate. The DC power source 232 and the oscillation circuit 234 may be replaced with the computer system 2. It is only required that the power supplying circuit 230 can supply power to the operation detecting section 201 in a non-contact manner.

The monitoring section 203 according to the exemplary embodiment includes the load detecting resistor 235 connected to the power supplying section 202 and the monitoring circuit 236 for detecting a current thereof. The monitoring circuit 236 may be replaced with the computer system 2. It is only required that the monitoring circuit 236 is configured to monitor a load of power supplied by the power supplying section 202 and to detect, from a change in the load, a user's pressing operation (switching on and off in the sheet switch 21).

In the exemplary embodiment, the load detecting resistor 235 and the monitoring circuit 236 provided in the monitoring section 203 detect a current flowing through the power supplying section 202. The monitoring section 203, however, may detect a voltage, power, or any other electrical characteristics. It is only required that the monitoring section 203 is configured to be capable of monitoring a load of power supplied by the power supplying section 202.

In the exemplary embodiment, a rotary operation unit of the invention is the jog dial 11 that designates a play speed and a play direction of music data by a user's rotary operation. However, a rotary operation unit of the invention may be an operation unit for any other function of the audio equipment. For example, a rotary operation unit of the invention may be an operation unit that sets a setting value in response to a user's rotary operation and registers the setting value in response to a user's touch operation. Specifically, a rotary operation unit of the invention may be a jog dial for setting output volume, or a jog dial for setting a parameter of a music synthesizer.

In the exemplary embodiment, the music data playing control system 1 is exemplified as the audio equipment according to the invention. The audio equipment according to the exemplary embodiment of the invention, however, is not limited to a device for controlling an external sound player, but may be a sound player itself that plays music data as sound.

The invention claimed is:

1. Audio equipment, comprising:
a rotary operation unit configured to be rotatably supported in relation to an equipment body;
an operation detecting section including a power receiving coil and provided for the rotary operation unit and in which an electric load changes in response to a user's operation through pressing or contact;
a power supplying section including a power supplying coil configured to induce electromotive force to the power receiving coil in a non-contact manner and provided for the equipment body; and
a monitoring section configured to monitor a current value of the power supplying coil to detect the user's operation from a change in the current value,
wherein the operation detecting section rotates together with the rotary operation unit.

2. The audio equipment according to claim 1, wherein the operation detecting section includes: a switching element configured to be switched by a pressing operation with pressing force of equal to or greater than predetermined pressing force; and the electric load that is switchable by the switching element.

3. The audio equipment according to claim 2, wherein the switching element is a sheet switch configured to be switched by the pressing operation with the pressing force of equal to or greater than the predetermined pressing force.

4. The audio equipment according to claim 2, wherein the switching element is formed in a ring shape and arranged on the rotary operation unit.

5. The audio equipment according to claim 1, wherein the operation detecting section includes: a switching element configured to be switched by a contact operation; and the electric load that is switchable by the switching element.

6. The audio equipment according to claim 5, wherein the switching element is an electrostatic capacitance sensor.

7. The audio equipment according to claim 5, wherein the switching element is formed in a ring shape and arranged on the rotary operation unit.

8. The audio equipment according to claim 1, wherein the rotary operation unit is an operation unit configured to designate a play speed and a play direction of music data by a rotary operation.

* * * * *